(12) United States Patent
Ng

(10) Patent No.: US 6,229,373 B1
(45) Date of Patent: May 8, 2001

(54) LEVEL SHIFTER

(75) Inventor: Solomon Ng, Singapore (SG)

(73) Assignee: SGS-Thomson Microelectronics Pte. Ltd. (SG)

( * ) Notice: Subject to any disclaimer, the term of this patent is extended or adjusted under 35 U.S.C. 154(b) by 0 days.

(21) Appl. No.: 08/993,264

(22) Filed: Dec. 18, 1997

(30) Foreign Application Priority Data

Dec. 19, 1996 (FR) ...................................... 96 16001

(51) Int. Cl.[7] ....................................... H03L 5/00
(52) U.S. Cl. ..................... 327/333; 327/540; 326/62; 326/80
(58) Field of Search ..................... 327/540, 539, 327/358, 50, 52, 74, 333, 530, 538, 560, 561, 563; 323/313; 330/252, 254, 261, 278, 285, 296; 326/62–63, 80–81

(56) References Cited

U.S. PATENT DOCUMENTS

| 4,498,040 | * | 2/1985 | Tatsushi et al. | 365/185.17 |
| 4,870,262 | * | 9/1989 | Hasegawa | 235/462.27 |
| 5,508,604 | * | 4/1996 | Keeth | 323/314 |
| 5,631,598 | * | 5/1997 | Miranda | 327/540 |
| 5,777,503 | * | 7/1998 | Faulk | 327/323 |

* cited by examiner

Primary Examiner—Timothy P. Callahan
Assistant Examiner—Minh Nguyen
(74) Attorney, Agent, or Firm—Wolf, Greenfield & Sacks, P.C.; James H. Morris; Theodore E. Galanthay

(57) ABSTRACT

The invention relates to a level shifter coupled to a circuit of a predetermined value, includes a differential amplifier with a first input coupled to the reference voltage and a second input receiving an intermediate voltage; a low impedance source providing the reference voltage; and a first operational amplifier providing the intermediate voltage from an input voltage. The output of the low impedance source is directly connected to the first input of the differential amplifier and the gain of the first operational amplifier is set to obtain a desired ratio between the reference voltage and the intermediate voltage.

16 Claims, 1 Drawing Sheet

# LEVEL SHIFTER

BACKGROUND OF THE INVENTION

1. Field of the Invention

The present invention relates to a level shifter which is to be used in conjunction with a circuit that requires a reference voltage which is also used as a reference for the level shifter.

2. Discussion of the Related Art

FIG. 1 shows a conventional structure of a level shifter used in conjunction with, for example, a resistor-tree digital-to-analog converter (DAC) 10. A resistor-tree DAC needs a precision reference voltage Vref of a predetermined value, for example 2 volts. This reference voltage is provided at low impedance, for example, as shown, by a band-gap reference source 12 followed by an operational amplifier 14 whose gain is set by two resistors 16, 17 for obtaining the desired value of the reference voltage Vref.

A DAC is usually supplied with a relatively low voltage, for example 5 volts, and its output voltage Vi is usually amplified and level shifted to adapt it to a circuit supplied at a higher voltage, for example 12 volts.

A level shifter needs an accurate reference voltage for determining the amount by which its input voltage (Vi) should be shifted with respect to a generally inaccurate common-mode voltage Vcm.

The level shifter of FIG. 1 is essentially a differential amplifier 20 including an operational amplifier 22. The inverting input of operational amplifier 22 is connected to its output Vo through a resistor 24 and receives a reference voltage qVref through a resistor 25. The non-inverting input of operational amplifier 22 receives the common-mode voltage Vcm through a resistor 27 and the voltage Vi to be shifted through a resistor 28. By choosing a normalized value 1 for resistors 25 and 28, and a normalized value k for resistors 24 and 27, the gain of the differential amplifier 20 is set to k.

With this arrangement, the output voltage Vo of the level shifter is expressed by:

$$Vo = Vcm + k(Vi - qVref).$$

The differential amplifier 20 of FIG. 1 has relatively low impedance inputs, whereby its input voltages, qVref and Vi, should be provided by low impedance sources.

The input voltage Vi of the differential amplifier 20 is provided from the output voltage of the resistor-tree DAC 10 through a unity gain operational amplifier 30.

In most cases, the reference voltage Vref needed by the resistor-tree DAC 10 is not adapted to the level shifter and must be either attenuated or amplified. In FIG. 1, reference voltage Vref is attenuated by a bridge of two resistors 32, 33 connected to ground. The values of resistors 32 and 33 are chosen so that the midpoint of this bridge provides the desired reference voltage qVref for the level shifter, where q is the ratio between the reference voltage for the level shifter and reference voltage Vref. The normalized values of resistors 32 and 33 are respectively 1–q and q. The midpoint of the resistor bridge being at relatively high impedance, its voltage is buffered by a unity gain operational amplifier 35 which provides the final reference voltage for the level shifter.

A drawback of the level shifter of FIG. 1 is that precision in its reference voltage qVref is lost due to the inherent offset voltage of operational amplifier 35.

SUMMARY OF THE INVENTION

An object of the present invention is to provide a level shifter for at least the above application, which is of particularly simple structure and overcomes the above drawback.

This and other objects is are achieved by a level shifter coupled to a circuit using an accurate reference voltage of a predetermined value, comprising a differential amplifier with a first input coupled to the reference voltage and a second input receiving an intermediate voltage; a low impedance source providing the reference voltage; and a first operational amplifier providing the intermediate voltage from an input voltage. The output of the low impedance source is directly connected to the first input of the differential amplifier and the gain of the first operational amplifier is set to obtain a desired ratio between the reference voltage and the intermediate voltage.

According to an embodiment of the invention, said circuit using the reference voltage is a resistor-tree digital-to-analog converter.

According to an embodiment of the invention, the reference voltage is provided from a band-gap source through an operational amplifier with suitable gain.

According to an embodiment of the invention, the differential amplifier comprises an operational amplifier and a resistor network for setting the gain of the differential amplifier at a desired value.

The foregoing and other objects, features and advantages of the present invention will appear in detail in the following description of non-limitative specific embodiments when taken in conjunction with the accompanying drawings.

DETAILED DESCRIPTION

An aspect of the invention is to directly use the accurate reference voltage Vref, needed by a circuit such as the resistor-tree DAC 10, as a reference for the level shifter. The reference voltage Vref being provided by a low impedance source (operational amplifier 14), the buffer 35 of FIG. 1 is no longer required.

Figure 1:
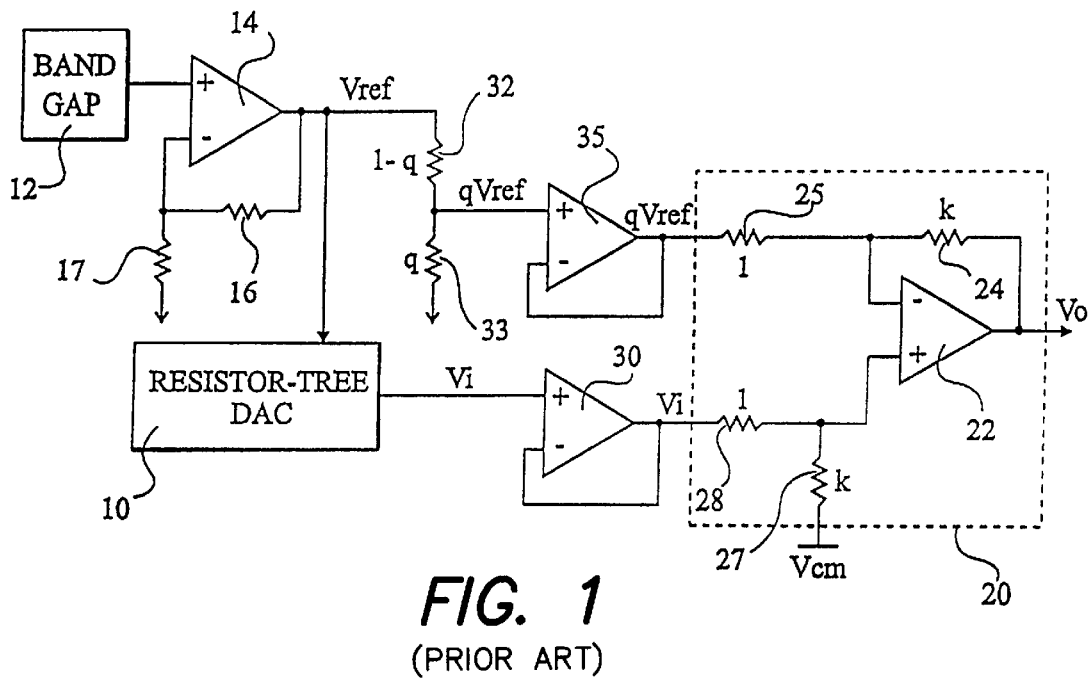
FIG. 1, previously described, shows a conventional level shifter associated to a resistor-tree digital-to-analog converter.

In order to maintain the same level shifting characteristics as in FIG. 1, the ratio between the reference voltage of the level shifter and the input voltage of this level shifter should be kept constant. In FIG. 1, the reference voltage Vref was multiplied by a factor q to provide the reference voltage of the level shifter, whereas the input voltage Vi was used unmodified. In contrast, according to the invention, the reference voltage Vref is used unmodified, whereas the input voltage Vi is divided by factor q.

Then, provided that the gain of the differential amplifier 20 is multiplied by q, the characteristics of the level shifter according to the invention are identical to those of FIG. 1. These same characteristics are thus obtained according to the invention with one operational amplifier less and improved precision of the level shifting due to a more direct connection between a precision reference source (band-gap source 12) and the reference input of the level shifter.

Figure 2:
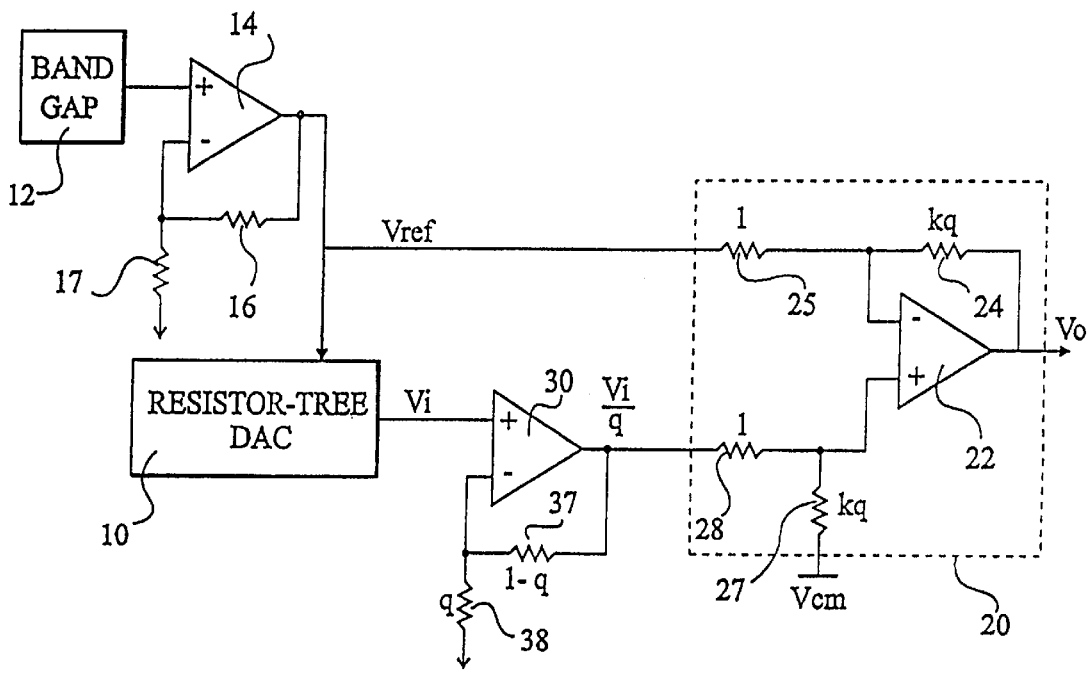
FIG. 2 shows an embodiment of a level shifter according to the invention.

The embodiment of FIG. 2 is based on the example of FIG. 1, whereby the same elements are designated with the same reference characters. According to the invention, the reference output Vref of operational amplifier 14 is directly provided to a terminal of resistor 25 constituting the inverting input of differential amplifier 20 (or the reference input of the level shifter).

Since the reference of the level shifter is divided by factor q with respect to FIG. 1, the input voltage Vi of the level shifter is also divided by factor q according to the invention, for maintaining the same ratio. Factor q being smaller than 1 in the example of FIG. 1, the division by factor q of voltage Vi is an amplification. This amplification is obtained through operational amplifier 30 which, instead of being connected for unity gain, is connected to two resistors 37 and 38 for providing the necessary gain I/q. Resistor 37, of normalized value 1–q, is connected between the output and the inverting input of operational amplifier 30. Resistor 38, of normalized value q, is connected between the inverting input of operational amplifier 30 and ground.

With this arrangement, the output voltage Vo of the level shifter is expressed by:

$$Vo=Vcm+G(Vi/q-Vref),$$

where G is the gain of differential amplifier 20. To obtain the exact same characteristics as the level shifter of FIG. 1, G is chosen equal to kq. This gain is obtained by replacing the resistors 24 and 27 of normalized value k in FIG. 1 by resistors of normalized value kq, as shown in FIG. 2.

The embodiment of FIG. 2 is adapted to the case where the reference needed in FIG. 1 for the level shifter was lower than the reference Vref needed for the resistor-tree DAC 10. If, instead, the reference needed for the level shifter in FIG. 1 were greater than the reference needed for the resistor-tree DAC, the operational amplifier 30 in FIG. 2 would be connected for having a unity gain and would be preceded by a resistor bridge having a suitable division ratio.

In any case, the level shifter according to the invention provides the same characteristics as the level shifter of FIG. 1, with substantially less components (operational amplifier 35 of FIG. 1) and a better accuracy due to the absence of the offset that was introduced in the reference voltage by operational amplifier 35.

Although the level shifter according to the invention has been described coupled to a resistor-tree DAC, those skilled in the art will understand that it applies to any situation where a same reference voltage should be used by the level shifter and another circuit.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A level shifter for a circuit using a reference voltage of a predetermined value, comprising:
    a differential amplifier with a first input directly receiving the reference voltage, and a second input receiving an intermediate voltage;
    a low impedance source providing the reference voltage; and
    a first operational amplifier providing the intermediate voltage from an output voltage of said circuit using the reference voltage;
    wherein the gain of the first operational amplifier is set to obtain a desired ratio between the reference voltage and the intermediate voltage;
    wherein the differential amplifier comprises an operational amplifier and a resistor network for setting the gain of the differential amplifier at a desired value;
    wherein the resistor network comprises an upper branch connected to the negative input of the operational amplifier of the differential amplifier and a lower branch connected to the positive input of the operational amplifier of the differential amplifier.

2. The level shifter of claim 1, wherein the upper branch comprises a first resistor connected between the first input of the differential amplifier and the inverting input of the operational amplifier of the differential amplifier.

3. The level shifter of claim 2, wherein the upper branch comprises a second resistor connected between the inverting input of the operational amplifier of the differential amplifier and the output of the operational amplifier of the differential amplifier.

4. The level shifter of claim 3, wherein the lower branch comprises a third resistor connected between the second input of the differential amplifier and the non-inverting input of the operational amplifier of the differential amplifier.

5. The level shifter of claim 4, wherein the lower branch comprises a fourth resistor connected between the non-inverting input of the operational amplifier of the differential amplifier and a voltage source.

6. The level shifter of claim 5, wherein the ratio of the resistance of the second resistor to the resistance of the first resistor equals the ratio of the resistance of the fourth resistor to the resistance of the third resistor.

7. A level shifter for a circuit using a reference voltage of a predetermined value, comprising:
    a differential amplifier with a first input directly receiving the reference voltage, a second input receiving an intermediate voltage, and an output voltage terminal representing an output of the level shifter;
    a low impedance source providing the reference voltage; and
    a first operational amplifier having at least one input and an output;
    said circuit receiving said reference voltage and providing at its output an input to said at least one input of said first operational amplifier;
    the output of said first operational amplifier providing said intermediate voltage;
    wherein the gain of the first operational amplifier is set to obtain a desired ratio between the reference voltage and the intermediate voltage;
    wherein the first operational amplifier is connected with said differential amplifier but absent any feedback from said output voltage terminal.

8. A level shifter for a circuit using a reference voltage of a predetermined value, comprising:
    a differential amplifier with a first input directly receiving the reference voltage, a second input receiving an intermediate voltage, and an output voltage terminal representing an output of the level shifter;
    a low impedance source providing the reference voltage; and
    a first operational amplifier having at least one input and an output;
    said circuit receiving said reference voltage and providing at its output an input to said at least one input of said first operational amplifier;
    the output of said first operational amplifier providing said intermediate voltage;
    wherein the gain of the first operational amplifier is set to obtain a desired ratio between the reference voltage and the intermediate voltage;

wherein the differential amplifier comprises an operational amplifier in a resistor network for setting the gain of the differential amplifier at a desired value;

wherein the resistor network comprises an upper branch connected to the negative input of the operational amplifier of the differential amplifier and a lower branch connected to the positive input of the operational amplifier of the differential amplifier.

9. The level shifter of claim 8, wherein the upper branch comprises a first resistor connected between the first input of the differential amplifier and the inverting input of the operational amplifier of the differential amplifier.

10. The level shifter of claim 9, wherein the upper branch comprises a second resistor connected between the inverting input of the operational amplifier of the differential amplifier and the output of the operational amplifier of the differential amplifier.

11. The level shifter of claim 10, wherein the lower branch comprises a third resistor connected between the second input of the differential amplifier and the non-inverting input of the operational amplifier of the differential amplifier.

12. A level shifter for a circuit using a reference voltage of a predetermined value, comprising:

a differential amplifier with a first input directly receiving the reference voltage, a second input receiving an intermediate voltage, and an output voltage terminal representing an output of the level shifter;

a low impedance source providing the reference voltage; and a first operational amplifier having at least one input and an output;

wherein the gain of the first operational amplifier is set to obtain a desired ratio between the reference voltage and the intermediate voltage;

said differential amplifier connected in an open loop circuit with said first operational amplifier.

13. The level shifter of claim 12, wherein said first operational amplifier is connected with said differential amplifier with an absence of any feedback from said output voltage terminal.

14. The level shifter of claim 12, wherein the differential amplifier comprises an operational amplifier in a resistor network for setting the gain of the differential amplifier at a desired value and wherein the resistor network comprises both an upper resistive branch connected to one terminal of the operational amplifier of the differential amplifier and a second resistor branch connected to the other input of the operational amplifier of the differential amplifier.

15. A level shifter for a circuit using a reference voltage of a predetermined value, comprising:

a differential amplifier with a first input directly receiving the reference voltage, a second input receiving an intermediate voltage;

a low impedance source providing the reference voltage; and a first operational amplifier providing the intermediate voltage from an output voltage of said circuit using the reference voltage;

wherein the gain of the first operational amplifier is set to obtain a desired ratio between the reference voltage and the intermediate voltage;

wherein the differential amplifier comprises an operational amplifier and a resistor network for setting the gain of the differential amplifier at a desired value;

wherein the resistor network includes at least one resistor network branch that intercouples the reference voltage and the first input of the differential amplifier.

16. A level shifter for a circuit using a reference voltage of a predetermined value, comprising:

a differential amplifier with a first input directly receiving the reference voltage, a second input receiving an intermediate voltage;

a low impedance source providing the reference voltage; and a first operational amplifier providing the intermediate voltage from an output voltage of said circuit using the reference voltage;

wherein the gain of the first operational amplifier is set to obtain a desired ratio between the reference voltage and the intermediate voltage;

wherein the differential amplifier comprises an operational amplifier and a resistor network for setting the gain of the differential amplifier at a desired value;

wherein the resistor network includes a predetermined branch connected to the positive input of the operational amplifier of the differential amplifier.

* * * * *